US005790612A

United States Patent [19]
Chengson et al.

[11] Patent Number: 5,790,612
[45] Date of Patent: Aug. 4, 1998

[54] SYSTEM AND METHOD TO REDUCE JITTER IN DIGITAL DELAY-LOCKED LOOPS

[75] Inventors: David P. Chengson, Aptos; Hansel A. Collins, Mountain View; Edward C. Priest, San Jose, all of Calif.; Scott W. Alvarez, Raleigh, N.C.

[73] Assignee: Silicon Graphics, Inc., Mountain View, Calif.

[21] Appl. No.: 609,068

[22] Filed: Feb. 29, 1996

[51] Int. Cl.⁶ .................................................. H03D 3/24
[52] U.S. Cl. .......................... 375/373; 327/148; 327/149
[58] Field of Search ............................ 375/373; 327/148, 327/149, 150, 153

[56] References Cited

U.S. PATENT DOCUMENTS

| | | | |
|---|---|---|---|
| 4,805,195 | 2/1989 | Keegan | 375/106 |
| 5,297,179 | 3/1994 | Tatsumi | 377/47 |
| 5,457,718 | 10/1995 | Anderson et al. | 375/373 |
| 5,459,766 | 10/1995 | Huizer et al. | 375/376 |
| 5,471,502 | 11/1995 | Ishizeki | 375/376 |
| 5,486,783 | 1/1996 | Baumert et al. | 327/147 |
| 5,544,203 | 8/1996 | Casasanta et al. | 375/376 |
| 5,574,756 | 11/1996 | Jeong | 375/376 |

*Primary Examiner*—Stephen Chin
*Assistant Examiner*—Mohammad Ghayour
*Attorney, Agent, or Firm*—Sterne, Kessler, Goldstein & Fox PLLC

[57] ABSTRACT

The present invention incorporates a variable delay circuit to add delay to a clock signal. In a preferred embodiment of the present invention, the delay is determined and fixed by a circuit employing the concept of a lock-and-leave circuit. This has the effect of fine tuning the delay determined by the lock-and-leave circuit. Mode bits allow a user to control the rate at which fine tuning occurs. Three update rates are provided in a preferred embodiment of the present invention. They are slow, medium, and fast.

14 Claims, 9 Drawing Sheets

| | FLOP A | FLOP B | ACTION |
|---|---|---|---|
| CASE 1 | 1 | 1 | DECREMENT |
| CASE 2 | 1 | 0 | LOCK CONDITION |
| CASE 3 | 0 | 0 | INCREMENT |
| CASE 4 | 0 | 1 | ERROR CONDITION |

FIG.6 ial lock.

SYSTEM AND METHOD TO REDUCE JITTER IN DIGITAL DELAY-LOCKED LOOPS

BACKGROUND OF THE INVENTION

1. Field of the Invention

The present invention relates generally to clock synchronization in digital systems. More particularly, the present invention relates to a system and method to reduce phase offset and jitter in digital delay-locked loops.

2. Related Art

Digital designers must often distribute a centralized clock signal to many components of a system. In high speed digital systems, however designers must overcome the problem of clock skew that the clock signal encounters upon its distribution. Clock skew is the difference in clock timing as seen by different loads that comprise the distribution load of a centralized clock. Clock skew includes static phase offset. To overcome the skew problem, designers employed digital delay-locked loops (DLLs). Digital DLLs are used to phase align the centralized clock signal input with a feedback input. The feedback input is generally a version of the centralized clock signal input that has been subjected to a delay substantially equal to that caused by the distribution load on the centralized clock signal.

Unfortunately, the use of digital DLLs presents its own set of problems. The most bothersome is that of jitter. All digital DLLs exhibit jitter. Jitter manifests itself in a region of uncertainty in the phase alignment of the inputs to the digital DLL.

Jitter only occurs during the operation of the digital DLL as the digital DLL tracks the input clock. A solution to the jitter problem, therefore, would appear to be to allow the digital DLL to achieve lock and then stop the digital DLL from tracking the input centralized clock signal. This idea is termed "lock-and-leave." When the digital DLL is not allowed to track, no jitter is introduced to the clock signal. An example of a lock-and-leave system is presented in U.S. Pat. No. 4,805,195 to Timothy J. Keegan et al.

The lock-and-leave solution has proven to be only a partial solution to the clock distribution design which attempts to achieve low clock jitter and low clock skew. It performs adequately in well controlled environments, that is, those environments characterized by small fluctuations in temperature (less than 40° C.) or voltage. Such environments generally exist in large systems that have dedicated facilities for their operation. In well controlled environments, parameters affecting clock skew stabilize, and the input clock signal does not tend to drift after the initial lock.

Well controlled environments do not generally exist in smaller systems such as workstations and personal computers. In such environments, skew parameters drift, resulting in an output clock signal that tends to exhibit significant skew fluctuations after the initial lock. To avoid the problem, system designers must design the system to operate within the maximum expected skew margins. This generally means slower clock frequencies. This is undesirable in today's marketplace where consumers constantly demand higher performance.

Thus, a designer employing a centralized clock system in such smaller systems is faced with a trade-off. Either use a lock-and-leave circuit and hope that the environment remains constant enough that clock skew will not be a significant problem, or allow the digital DLL to track and hope that jitter does not become a significant problem.

Because neither solution offers a designer of high speed digital systems a high degree of comfort, it would be useful to employ a digital DLL that is not limited to only tracking or not tracking. Thus, what is required is a Digital DLL that can track, not track, or track some of the time. Furthermore, it would be useful if the update rate of tracking is selectable to fit a particular user environment.

A designer that chooses tracking in conventional systems faces yet another hurdle to achieving clock synchronization. Tracking generally involves increasing or decreasing the delay of a buffered version of the output clock signal to phase align the buffered version of the output clock signal with the centralized clock signal. Conventional digital DLLs incorporate multiplexers to switch a clock signal having a desired delay to become the output clock signal. Using multiplexers to switch in a different delay clock signal results in undesirable glitches in the resulting clock signal. Deglitching circuits, sometimes called synchronizers, are employed in conventional systems to solve the deglitching problem. An example deglitching circuit is illustrated in U.S. Pat. No. 5,036,528, Self-Calibrating Clock Synchronizing Scheme, to Costentino et al. However, such circuits are complex and expensive to design, and have a low mean time between failure (MTBF) due to the metastable nature of flip-flops. Thus, what is required is a deglitching circuit that is easier and cheaper to design and use, and more reliable than available in conventional systems.

SUMMARY OF THE INVENTION

The present invention incorporates a variable delay circuit to add delay to a clock signal. In a preferred embodiment of the present invention, a coarse delay is determined and fixed by a circuit employing the concept of a lock-and-leave circuit. The present invention effectively fine tunes the coarse delay fixed by the lock-and-leave circuit.

Care must be used when adding delay to the clock signal to ensure that no glitches are added to the signal. The circuit must ensure that the clock signal does not glitch during the update process. The amount of delay present in the path of the fine tune circuit is affected by changing the effective propagation delay of variable delay elements (VDEs). Since the change in a variable delay element occurs over a period of time that is much greater than the edge rate of the clock signal, clock signal glitches are avoided.

The rate at which the fine tune circuit is updated is determined by N mode bits. Accordingly, there are $2^N$ possible update rates. The N mode bits are input to a control circuit. The control circuit executes an update sequence. At the completion of the update sequence, the control lines of the variable delay elements have been adjusted to either increase or decrease the amount of delay present in the clock path for skew compensation.

The amount of delay present in the clock path is determined by the variable delay elements. Control lines, which are bussed to each VDE, set the propagation delay of all the VDEs, thereby controlling the amount of delay inserted into the clock path.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the digit(s) to the left of the two rightmost digits in the corresponding reference number.

BRIEF DESCRIPTION OF THE FIGURES

The present invention will be described with reference to the accompanying drawings, wherein.

DETAILED DESCRIPTION OF THE PREFERRED EMBODIMENTS

The present invention incorporates a variable delay circuit to add delay to a clock signal. In a preferred embodiment of the present invention, a coarse delay is determined and fixed by a circuit employing the concept of a lock-and-leave circuit. The present invention effectively fine tunes the coarse delay determined by the lock-and-leave circuit.

Figure 1:
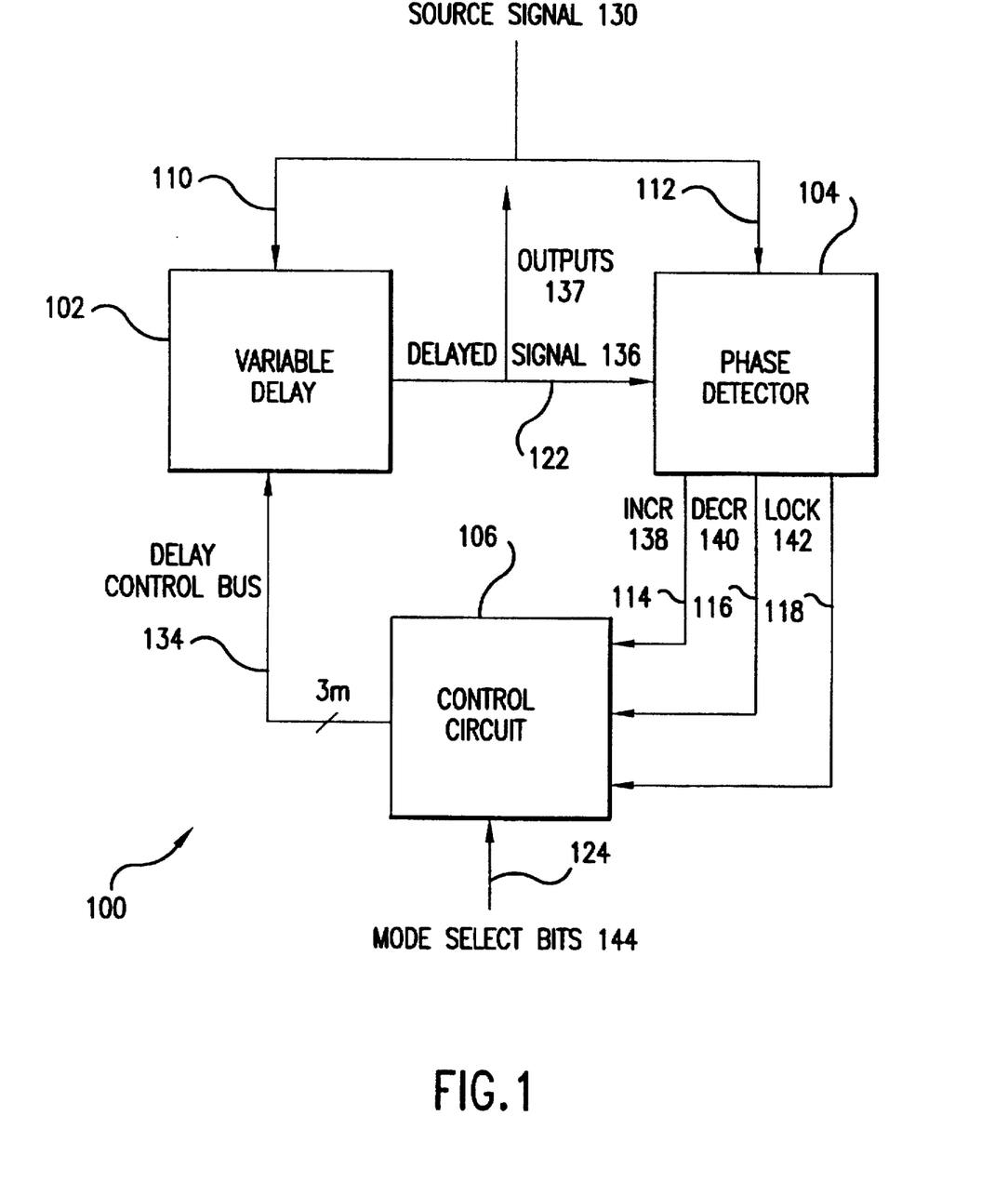
FIG. 1 illustrates a tracking circuit 100 having a user controllable tracking rate according to a preferred embodiment of the present invention.

Referring to FIG. 1, a user controllable tracking circuit 100 is illustrated. The tracking circuit 100 includes a variable delay circuit 102, a phase detector 104, and control circuit 106.

The variable delay circuit 102 inputs a source signal 130 on line 110. In the preferred embodiment, the source signal 130 is the output of the lock-and-leave delay circuit (described below with reference to FIG. 5). The variable delay circuit 102 inputs delay control signals over delay control bus 134. In the preferred embodiment, there are 3 control signals for each variable delay element (discussed below) in the variable delay circuit 102. The delay control signals carried by delay control bus 134 control the amount of delay that the variable delay circuit 102 inserts into clock signal paths 136 and 137. The variable delay circuit 102 outputs a delayed clock signal 136 on line 122. This signal is also the output clock signal 137 of the variable delay circuit 102. The output clock signal 137 is used to clock distributed loads in a system (not shown) that uses a centralized clock.

The phase detector 104 inputs the delayed clock signal 136 from line 122. The phase detector 104 also inputs a source signal 130 over line 112. In this specification, the "source signal 130" is alternately referred to as the "source clock signal 130." The phase detector 104 compares the phase of the source signal 130 to the phase of the delayed clock signal 136 to determine whether the phase of the delayed clock signal 136 leads, lags, or is in phase with the phase of the source signal 130.

If the phase detector 104 determines that the phase of the delayed clock signal 136 leads the phase of the source signal 130, the system must increase the amount of delay of the delayed clock signal 136 to achieve phase lock. Thus, the phase detector 104 informs the control circuit 106 to increment the delay of the variable delay circuit 102. This is accomplished by sending an increment signal 138 over line 114.

If the phase detector 104 determines that the phase of the delayed clock signal 136 lags the phase of the source signal 130, the system must decrease the delay of the delayed clock signal 136 to achieve phase lock. Thus, the phase detector 104 informs the control circuit 106 to decrement the delay of the variable delay circuit 102. This is accomplished by sending a decrement signal 140 over line 116.

If the phase detector 104 determines that the phase of the delayed clock signal 136 is in phase with the phase of the source signal 130, the system does not modify the delay of the delayed clock signal 136. This is accomplished by sending a lock signal 142 over line 118. The generation of increment signal 138, decrement signal 140, and lock signal 142 is described below.

The control circuit 106 inputs the increment signal 138, decrement signal 140, and lock signal 142 generated by the phase detector 104. The control circuit 106 also inputs one or more mode select bits 144 that corresponds to a user selectable tracking rate. The user selectable tracking rate is the rate at which the present invention updates the variable delay circuit 102. The control circuit 106 outputs delay control signals on delay control bus 134 to increment, decrement, or not modify the delay of the variable delay element 102. To vary the tracking rate, the control circuit 106 outputs delay control signals on delay control bus 134 at varying times corresponding to a tracking update rate indicated by the mode select bits 144 over line 124.

Two mode select bits 144 are used in the preferred embodiment of the present invention. The two mode select bits 144 indicate whether slow, medium, fast, or no tracking is desired. It would be apparent to those skilled in the art how to design and implement a decoder that selects a tracking mode in accordance with two input mode bits. Further, it would be apparent to those skilled in the art to increase the number of mode bits to provide for more tracking states.

Figure 2:
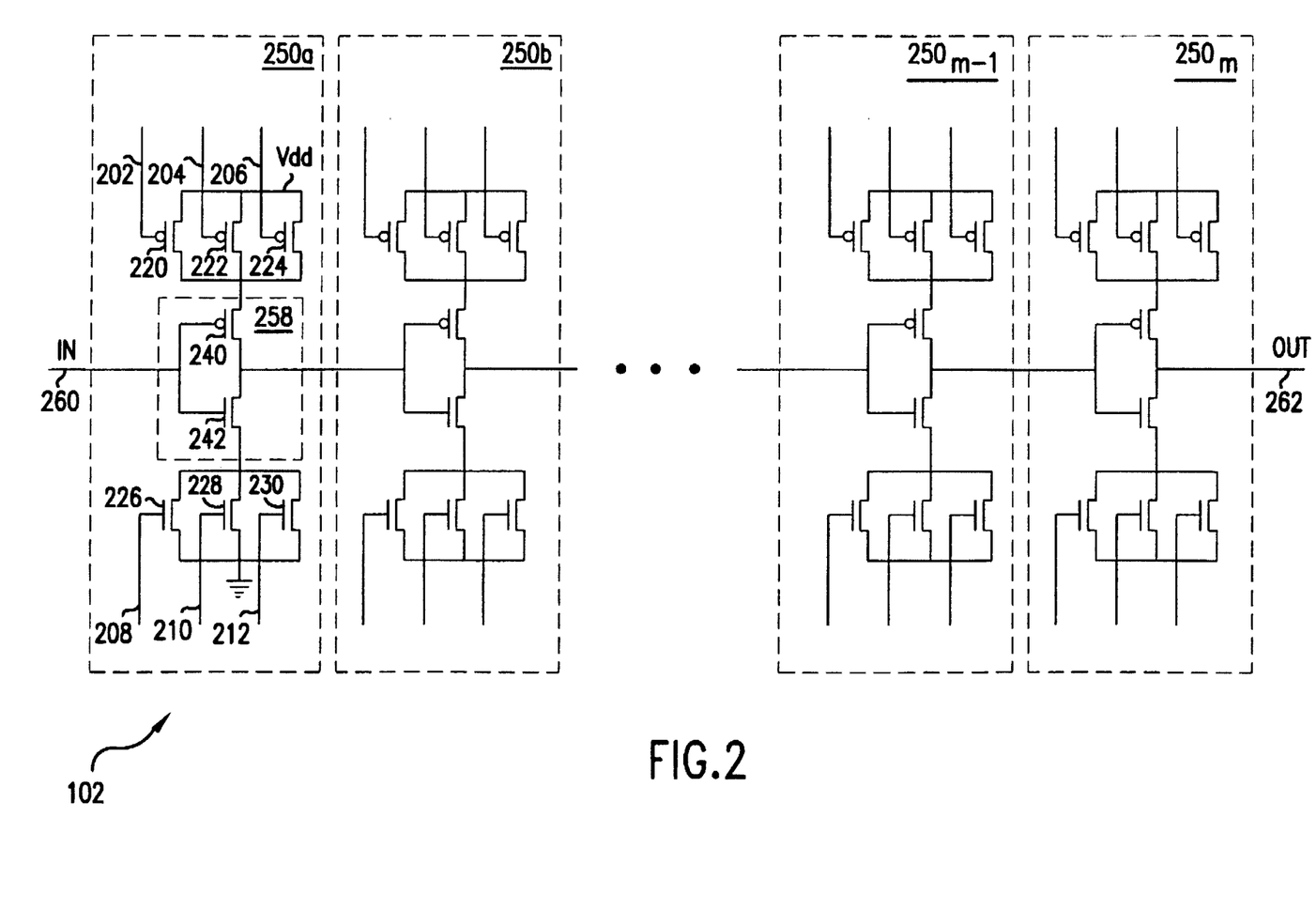
FIG. 2 illustrates a variable delay element 102 according to a preferred embodiment of the present invention.

Referring to FIG. 2, a variable delay circuit 102 according to a preferred embodiment of the present invention is illustrated. The variable delay circuit 102 comprises a plurality of M variable delay elements (VDEs) 250a, 250b, ... 250m connected in series. M can be an even number in order to avoid outputting a delayed, but inverted, representation of an input signal, IN.

It would be apparent to one skilled in the art that a differential inverter could be used. If a differential inverter is used, M does not have to be even. This is because either the true or complement signal of the differential inverter can be used. The VDEs 250a, 250b, ... 250m are illustrated in FIG. 2.

Only the VDE 250a is described below. Each of the remaining M-1 VDEs 250b, ... 250m, however, operates in a substantially the same manner to the VDE 250a.

Each VDE 250a comprises a CMOS inverter 258. The CMOS inverter 258 comprises a PMOS pull-up transistor 240 and an NMOS pull-down transistor 242. Coupled to each PMOS pull-up transistor 240 are transistors 220, 222, and 224. Transistors 220, 222, and 224 are connected in parallel. Coupled to each NMOS pull-down transistor 242 are transistors 226, 228, and 230. Transistors 226, 228, and 230 are connected in parallel. Transistors 220, 222, 224, 226, 228, and 226 are controlled by delay control bus signals on lines 202, 204, 206, 208, 210, and 212 respectively. It would be apparent to those skilled in the art that lines 202, 204, 206, 208, 210, and 212 comprise the delay control bus 134. The delay control bus signals are generated by the control circuit 106 as described above.

As described above, there are 3 control signals supplied to each VDE in the preferred embodiment of the current invention. It would be apparent to those skilled in the art that a fewer or a greater number of control signals can be applied to the VDEs as required by a particular implementation of the present invention. For example, by supplying an independent control signal to transistors 226, 228, and 230 on lines 208, 210, and 212 respectively, the pull down characteristics of the CMOS inverter 258 can be controlled independently of the pull-up characteristics.

In the preferred embodiment, the effective resistance of the transistors 220, 222, 224 is modulated to alter the pull-up time for the pull-up transistor 240 of the CMOS inverter 258. Likewise, the effective resistance of the transistors 226, 228, and 230 is modulated to alter the pull-down time for the pull-down transistor 242 of the CMOS inverter 258. The modulation is performed such that the incremental resistance change is small. By keeping the incremental resistance changes small, the likelihood of undesirable glitches in the circuit is significantly reduced.

The size of the transistors is chosen to control the range of the effective resistance. In the preferred embodiment, the transistors 220, 222, 224 have different sizes. It would be apparent to those skilled in the art that transistors of different sizes can be used to realize the variable delay described above.

It would be apparent to those skilled in the art that control signals on the control bus 134 allow for other combinations of the transistors. Such other combinations allow for different delays to be added to the IN signal, i.e., the SOURCE signal 130. For example, the middle-sized transistor can be the transistor that is always on. To achieve less delay, the next smallest transistor can be added. To achieve even less delay, the largest transistor is added.

In an alternative embodiment, each VDE is set such that a minimal number of the delay control transistors remain active to maintain VDE operation. The minimal number of active delay control transistors corresponds to the maximum propagation delay of a VDE at a particular process, control, and temperature. When all delay control transistors are active, the minimal propagation delay of the VDE is achieved for a given process, voltage, and temperature operator point. This causes a change in the delay that the signal experiences through each VDE 250a, 250b, ... 250m because an RC time constant, inherent in each VDE, changes. As a result, the time required for the delay element to pull the input signal up to $V_{dd}$ or down to ground changes. How much delay is added depends on the number of transistors 220, 222, 224, 226, 228, and/or 230 that are turned on.

It is important to note that the period of the clock signal is not changed other than for the cycle or cycles in which delay is added. The capacitive loading offered by the gates of the delay control transistors on the delay control signals on delay control bus 134 prevents a rapid transition of the signal voltages. Thus, there is a slow voltage transition at the gate of the delay control transistors (e.g., transistors 220, 222, and 224). The slow voltage transition at the gates of the delay control transistors prevents a rapid turn-on of the delay control transistors, and produces a gradual change between the transistor inactive to active state. The gradual switching avoids undesirable clock signal glitches by spreading the transition from one delay value to another over a period of time that is much greater than the edge rate (i.e., rise and fall times) of the clock signal.

Figure 3A:
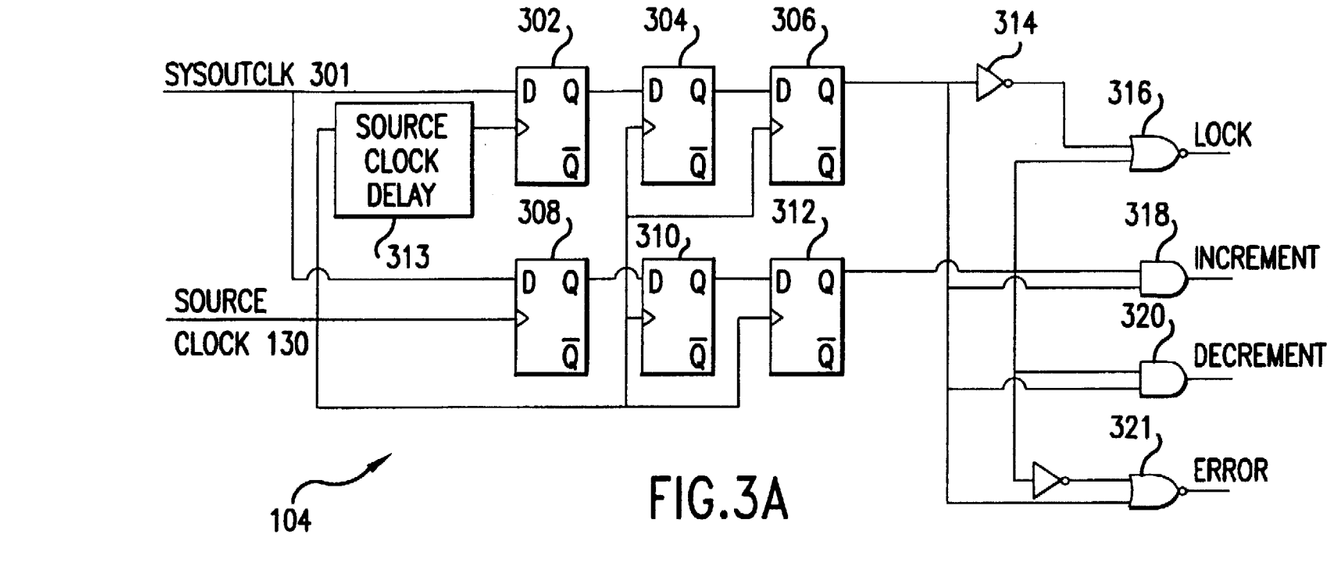
FIG. 3A illustrates a phase detector 104 according to a preferred embodiment of the present invention.

A phase detector 104 according to a preferred embodiment of the present invention is illustrated in FIG. 3A. The phase detector 104 determines the relative phase difference between a SYSOUTCLK signal 301 and a SOURCE CLOCK signal 130. In the preferred embodiment of the present invention, the SYSOUTCLK signal 301 is the delayed clock signal 136. The SOURCE CLOCK signal 303 is a general reference clock signal having a phase to which a digital DLL tries to align delayed clock signal 136. Such a digital DLL is illustrated in and described later with respect to FIG. 5.

In operation, the phase detector 104 determines whether the SYSOUTCLK signal 301 and the SOURCE CLOCK signal 130 are in phase to within a predetermined window or delay. The window, or delay, accounts for the unavoidable delay caused by process and metal delays that are inherent in a chip fabrication process. The predetermined delay is generated by the SOURCE CLOCK delay circuit 313. The window and the SOURCE CLOCK delay circuit 313 are described in detail below.

The phase detector 104 of the preferred embodiment of the present invention comprises six D-type flip-flops 302, 304, 306, 308, 310, and 312. Flip-flops 304, 306, 308, 310, and 312 input the SOURCE CLOCK signal 130 as their input clock. Flip-flop 302 inputs a delayed version of the SOURCE CLOCK signal 130 as its input clock. By delaying the SOURCE CLOCK signal 130 and then comparing it to the SYSOUTCLK signal 301, the phase detector 104 is able to determine whether the SYSOUTCLK signal 301 and the SOURCE CLOCK signal 303 are in phase with one another to within a resolution amount. The resolution amount is determined by the amount of delay introduced to the SOURCE CLOCK 130 signal by the SOURCE CLOCK delay circuit 313.

The phase detector 104 indicates a lock condition when flip-flop 306 outputs a logic level 1 and flip-flop 312 outputs a logic level 0. The lock condition is determined by a NOR gate 316.

The phase detector 104 indicates that the phase of SYSOUTCLK 301 leads the phase of the SOURCE CLOCK signal 303 when flip-flop 306 outputs a logic level 1 and flip-flop 312 outputs a logic level 1. An AND gate 320 indicates the condition where the phase of the SYSOUT-CLK signal 301 leads the phase of the SOURCE CLOCK signal 303. When the AND gate 320 detects that the SYSOUTCLK signal 301 leads the SOURCE CLOCK signal 303, the phase detector 104 outputs an increment signal to increase the delay of the SYSOUTCLK signal 301.

The phase detector 104 indicates that the phase of the SYSOUTCLK signal 301 lags the phase of the SOURCE CLOCK signal 303 when flip-flop 306 outputs a logic level 0 and flip-flop 312 outputs a logic level 0. A NOR gate 318 indicates the condition where the phase of the SYSOUT-CLK signal 301 lags the phase of the SOURCE CLOCK signal 303. When the NOR gate 318 detects that the SYSOUTCLK signal 301 lags the SOURCE CLOCK signal 303, the phase detector 104 outputs a decrement signal to decrease the delay of the SYSOUTCLK signal 301.

The case where flip-flop 306 outputs a logic level 0 and flip-flop 312 outputs a logic level 1 is an illegal condition according to the preferred embodiment of the present invention. A NOR gate 321 detects the illegal state. If the NOR gate 321 detects the illegal state, the phase detector 104 outputs an error signal. In a preferred embodiment of the present invention, the error signal is used to alert a system operator of an error condition in the clock synchronization system.

It would be apparent to those skilled in the art that the phase detector 104 can be implemented in a variety of ways. For example, only flip-flops 302 and 308 are required in order to generate the lock, lead, lag, and error signals. The phase detector 104 illustrated in FIG. 2 provides a more stable solution with improved MTBF due to metastability in flip-flops than a phase detector implementing fewer flip-flops.

Figure 3B:
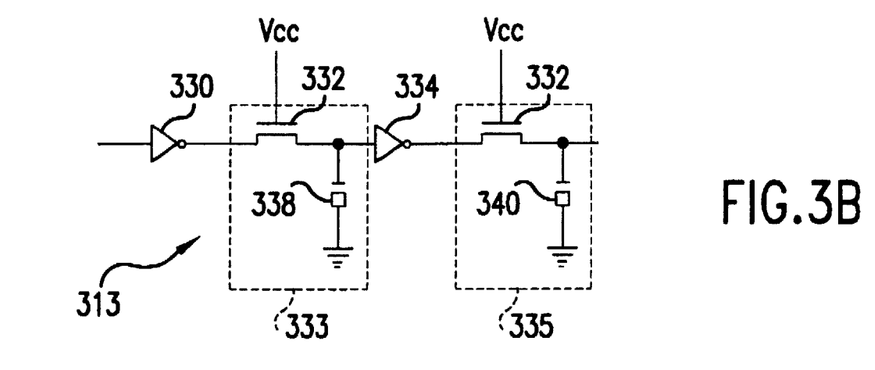
FIG. 3B illustrates a circuit 313 used by the phase detector to delay a clock signal.

FIG. 3B illustrates a SOURCE CLOCK delay circuit 313 for delaying the SOURCE CLOCK signal 303. As described below, a tap in delay line 504 comprises two inverters. To generate the desired delay, the output of each inverter is applied to a resistor-capacitor (RC) circuit 333, 335.

Each RC circuit 333, 335 has an associated RC time constant. The RC time constant determines the delay of a signal through the RC circuit 333, 335. The aggregate RC time constant through the SOURCE CLOCK delay circuit 313 determines the SOURCE CLOCK signal 303 delay.

In the preferred embodiment, the resistor is implemented as an N-channel pass transistor 332. In the preferred embodiment, the capacitor is implemented as an N-channel capacitor (oxide). Implementing the RC circuit with an N-channel pass transistor and an N-channel capacitor (oxide) has the circuit advantage of more closely tracking the intrinsic inverter delay than does an RC circuit implemented with either metal or polysilicon.

Figure 3C:
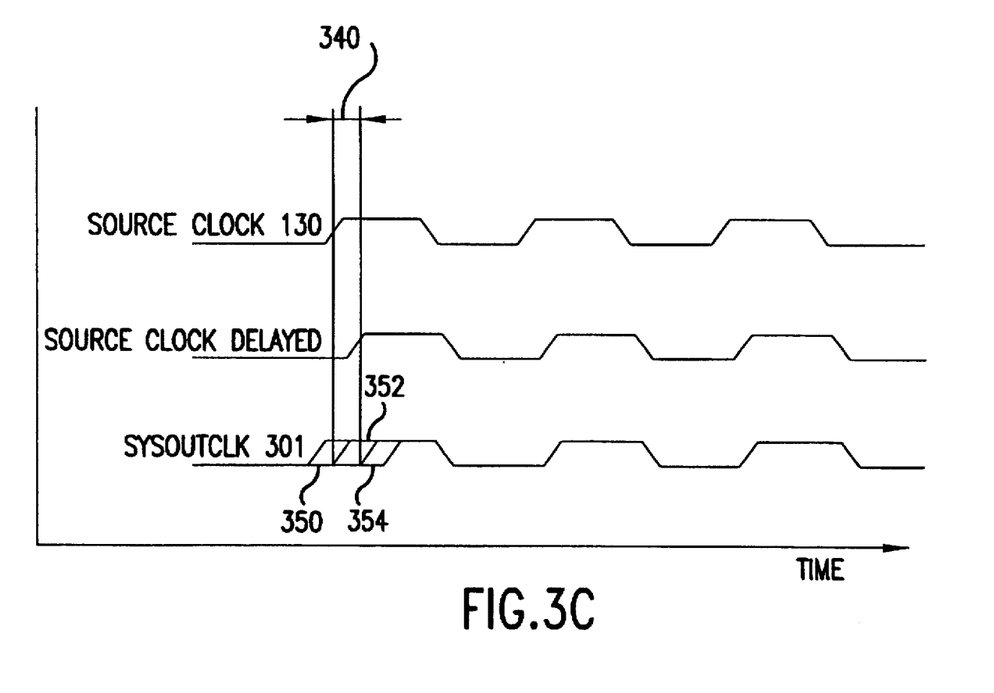
FIG. 3C illustrates the relationship between inputs to phase detector 104.

Referring to FIG. 3C, the lead 350, lock 352, and lag 354 regions are described. FIG. 3C illustrates the relationship between the SYSOUTCLK signal 301 and the delayed version of the SOURCE CLOCK signal 303. The phase detector 104 determines the relationship as described above.

If the SYSOUTCLK signal 301 goes to logic level 1 in lead region 350, it leads the SOURCE CLOCK signal 303. In this case flip-flops 306 and 312 each output a logic level 1. This indicates that the delay of the SYSOUTCLK signal 301 must be increased to achieve phase lock.

Figure 3D:
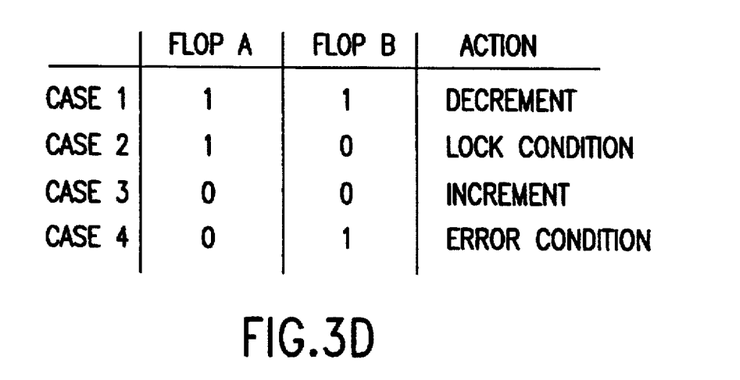
FIG. 3D illustrates the outputs of phase detector 104 in tabular form.

If the SYSOUTCLK signal 301 goes to logic level 1 in lock region 352, it is in phase with the SOURCE CLOCK signal 303. In this case flip-flop 306 outputs a logic level 1 and flip-flop 312 outputs a logic level 0. If the SYSOUTCLK signal 301 goes to logic level 1 in lag region 354, it lags the SOURCE CLOCK signal 303. In this case flip-flops 306 and 312 each output a logic level 0. This indicates that the delay of the SOURCE CLOCK signal 303 must be reduced to achieve phase lock. The lead (decrement), lock, lag (increment) and error conditions are indicated in tabular form in FIG. 3D.

The SOURCE CLOCK delay circuit 313 determines the width of a lock region 352. The width can be thought of as a window 340 or delay in which the input of the phase detector 104 are considered to be in phase. The window size of window 340 is determined by the worst case process delay and metal delay inherent in the fabrication of a chip implementing the present invention. A 50% delay is used in the preferred embodiment of the present invention.

The SOURCE CLOCK delay circuit 313 must delay the SOURCE CLOCK signal 303 by a delay that is greater than a tap delay of a delay line 504, i.e., the resolution of delay line 504. If the SOURCE CLOCK delay circuit 313 delays the SOURCE CLOCK signal 303 by a delay that is smaller than the incremental delay of a tap in delay line 504, the phase detector 104 could not be guaranteed to achieve a lock condition. This is because the width of the lock region 352 would be too small to ensure that a delayed clock signal will eventually fall into the lock region 352.

Figure 4A:
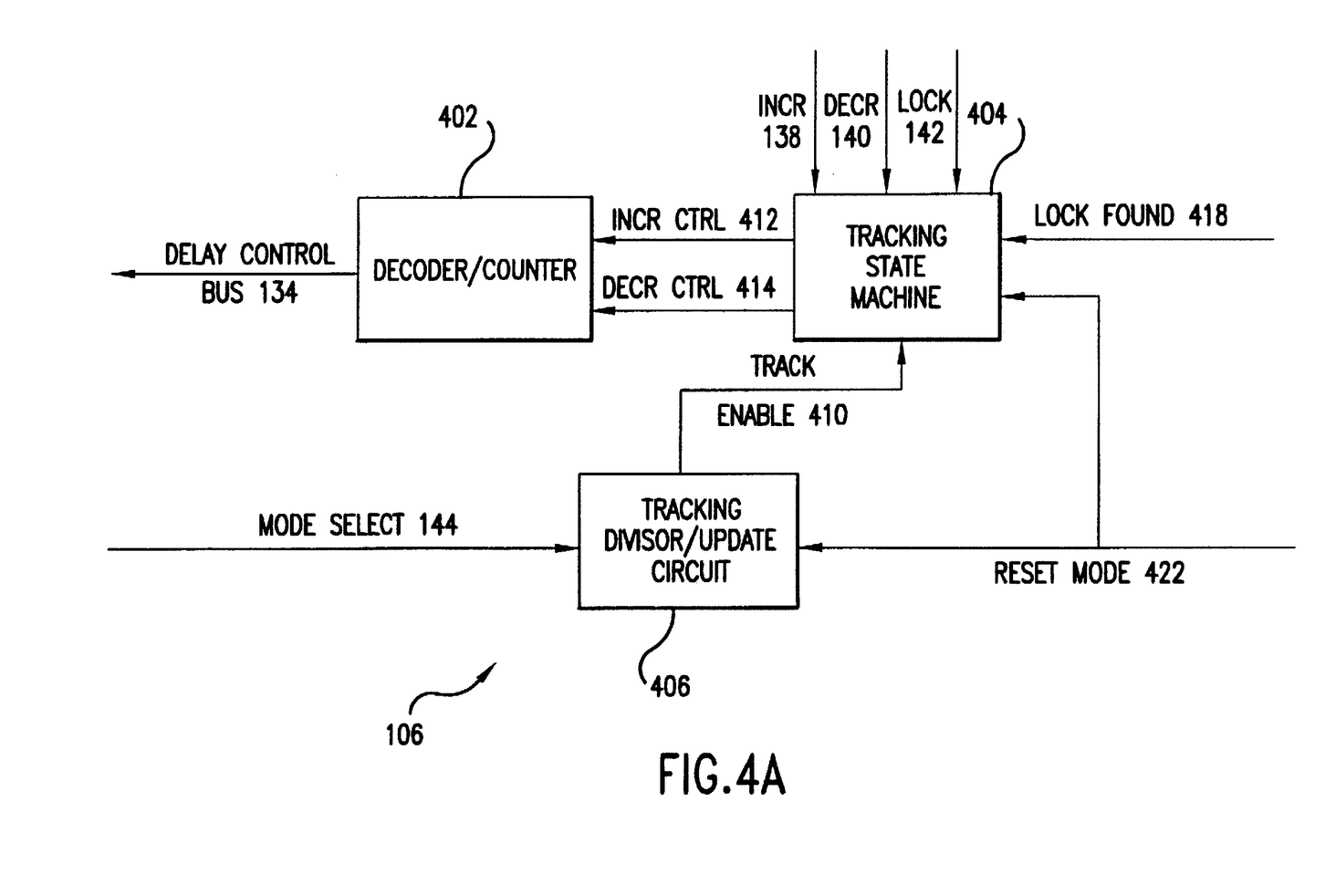
FIG. 4A illustrates control circuit 106 according to a preferred embodiment of the present invention.

Referring to FIG. 4A, the control circuit 106 according to a preferred embodiment of the present invention is explained. The control circuit 106 comprises a decoder/counter circuit 402, a tracking state machine 404, and a tracking divisor/update circuit 406.

The decoder/counter circuit 402 comprises a decoder (not shown) and a counter (not shown). A decoder and counter for the preferred embodiment of the present invention can be constructed in a well known manner. The decoder/counter circuit 402 inputs increment control 412 and decrement control 414 from the tracking state machine 404. The increment control 412 increments the count of the counter in the decoder/counter circuit 402. The decrement control 414 decrements the count of the counter in the decoder/counter circuit 402. The output of the counter in the decoder/counter circuit 402 is decoded to generate the delay control signals. The delay control signals are transmitted to the variable delay circuit 102 by the delay control bus 134. The delay control signals on delay control bus 134 are output to the variable delay circuit 102 to control the amount of delay into the source clock signal 130.

The tracking state machine 404 inputs increment signal 138, decrement signal 140, and lock signal 142 from the phase detector 102. The tracking state machine outputs control signals, increment control 412 and decrement control 414, to the decoder/counter circuit 402. The tracking state machine 404 outputs the signals only when it determines that an update should occur. It determines that an update should occur when the tracking divisor/update circuit 406 asserts a track enable signal 410 (the generation of which is described below with reference to FIG. 4C). If the tracking divisor/update circuit 406 does not assert a track enable signal 410, the tracking state machine 404 does not output the increment signal 412 or decrement signal 414 to the decoder/counter 402. The rate at which the tracking state machine 404 is allowed to update the VDEs is determined by the rate that the track enable signal 410 is asserted by the tracking divisor/update circuit 406. The rate at which the tracking divisor/update circuit 406 asserts the track enable signal 410 is determined by the mode select signal 144. The actual assertion rate is a multiple of the source clock period, which is determined by the mode select signal 144.

The present invention is an enhancement of the lock-and-leave concept. As described above, the lock-and-leave circuit provides a coarse phase lock, while the variable delay element 102 fine tunes the coarse phase lock. A lock found signal 418 is input to the tracking state machine 404 by a lock-and-leave state machine 508 (described below with reference to FIG. 5). The lock found signal 418 indicates that the lock-and-leave circuit has found a coarse lock. Only then does the present invention try to fine tune lock.

In the preferred embodiment of the present invention, the lock signal 142 has two purposes. It first determines whether the lock-and-leave circuit has achieved lock. Once this occurs, the lock found 418 signal is asserted. Thereafter, the lock signal 142 is an indication of whether the variable delay element 102 has added sufficient delay to align the phase of the source clock signal 130 and delayed source clock signal 136.

Figure 4B:
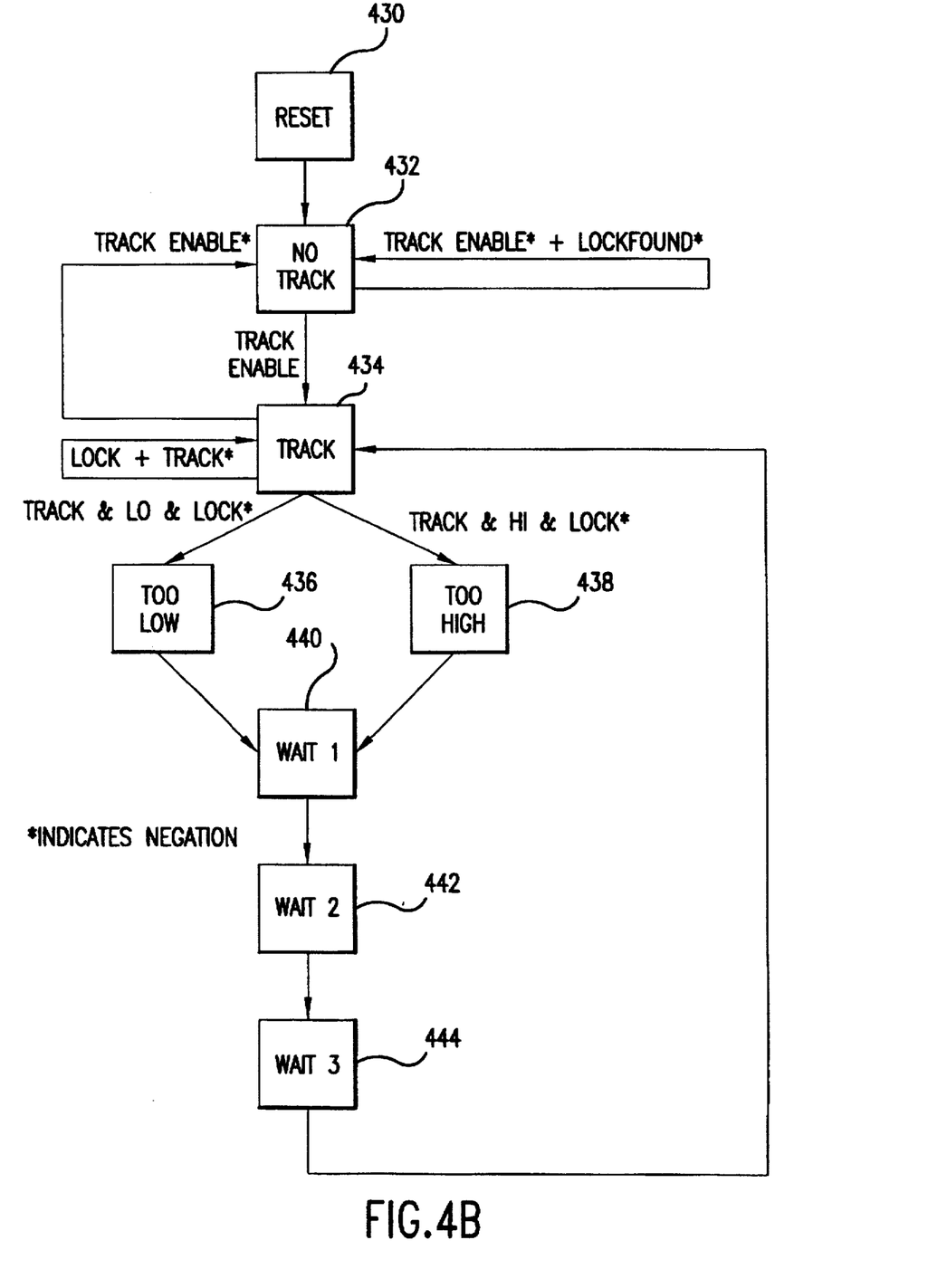
FIG. 4B is a tracking state diagram, implemented by a tracking state machine 404, according to a preferred embodiment of the present invention.

FIG. 4B illustrates the state diagram implemented by the state machine 404 of a preferred embodiment present invention. In FIG. 4B, the "*" indicates signal negation. The tracking state machine 404 begins in reset state 430. The reset state may be entered upon system startup or assertion of a reset mode signal 422.

The tracking state machine 404 then enters "no track" state 432. The variable delay circuit 100 does not track in the "no track" state 432. The tracking state machine 404 remains in the "no track" state 432 until a track enable signal 410 is generated by tracking divisor/update circuit 406 or the lock found signal 418 is asserted.

Upon the assertion of the track enable signal 410 or the lock found signal 418, the tracking state machine 404 enters "track" state 434. The tracking state machine 404 remains in the "track" state while the phase detector 102 indicates a lock condition, or the system is not allowed to track even though tracking is enabled. The tracking state machine 404 returns to the "no track" state 432 if the track enable signal 410 is deasserted. If the lock signal 138 is asserted indicating the phase detector 104 has achieved lock and the system can track, the tracking state machine 404 determines whether the phase of the SYSOUTCLK signal 301 is too high or too low. The tracking state machine 404 determines that the phase of the SYSOUTCLK signal 301 is too high when the phase detector 104 asserts the increment signal 140. The tracking state machine 404 determines that the phase of the SYSOUTCLK signal 301 is too low when the phase detector 104 asserts the decrement signal 138.

If the tracking state machine 404 determines that the phase of the SYSOUTCLK signal 301 is too high, the tracking state machine 404 enters state 438. In state 438, the tracking state machine 404 outputs an increment signal 412 that causes the counter in the decoder/counter circuit 402 to increment.

If the tracking state machine 404 determines that the phase of the SYSOUTCLK signal 301 is too low, the tracking state machine 404 enters state 436. In state 436, the tracking state machine 404 outputs an decrement signal 414 that causes the counter in the decoder/counter circuit 402 to decrement.

After the tracking state machine 404 outputs the appropriate control signals, it enters a series of wait states, wait1 440, wait2 442, and wait3 444. Wait states 440, 442, and 444 allow the desired control changes to propagate through the system prior to initiating a new tracking update sequence. Upon completion of the wait3 state 444, the tracking state machine returns to track state 434.

The tracking divisor/update circuit 406 determines the rate of update for the variable delay circuit 102. The rate of update is user selectable. According to a preferred embodiment of the present invention, the selected mode is indicated by mode select bits 144. Tracking divisor/update circuit 406 outputs a track enable signal 410. The track enable signal 410 allows the tracking state machine 404 to cause delay control signals on delay control bus 134 to update the delay of the variable delay element 102.

Figure 4C:
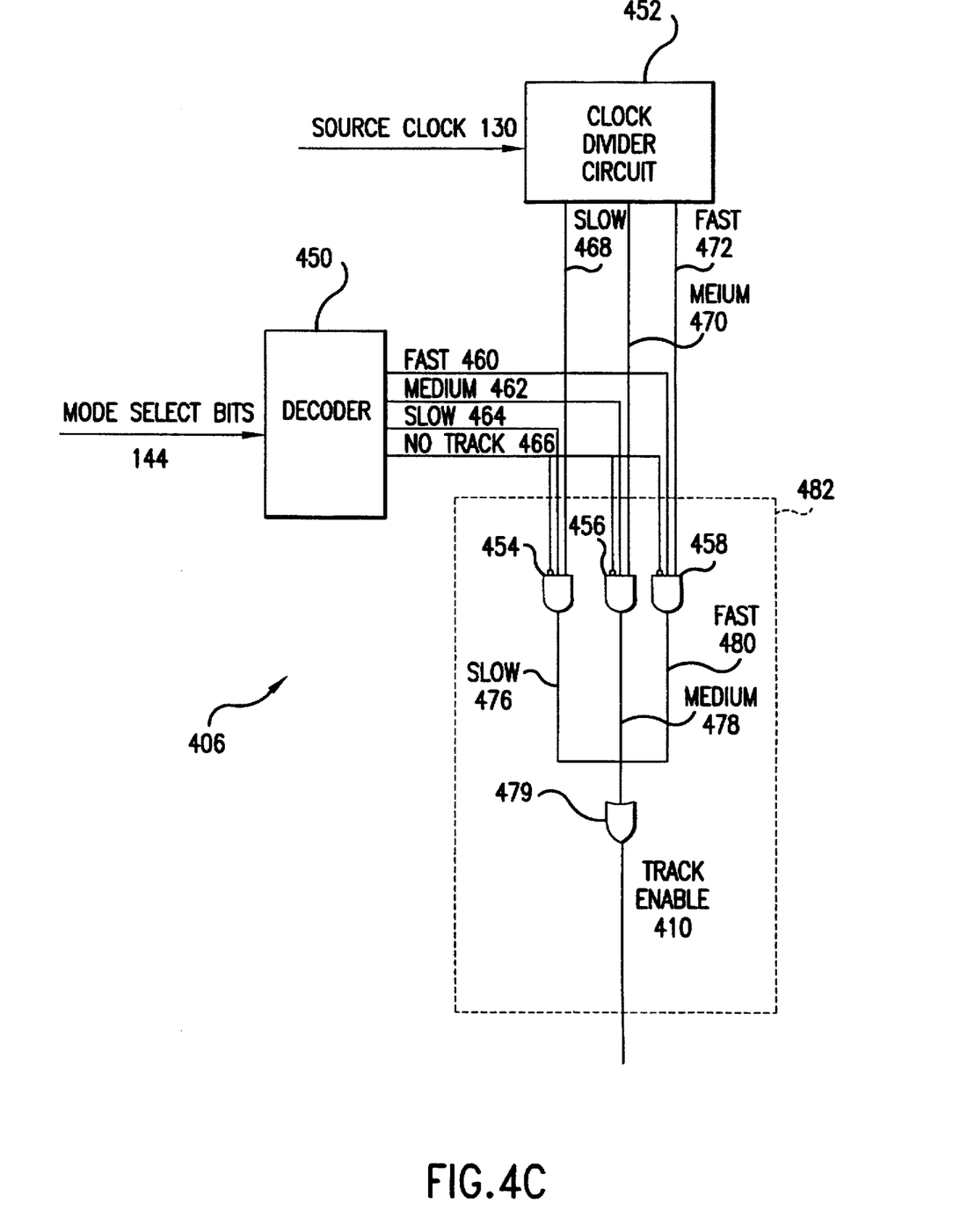
FIG. 4C is a tracking divisor/update circuit 406 according to a preferred embodiment of the present invention.

FIG. 4C illustrates a tracking divisor/update circuit 406 according to a preferred embodiment of the present invention. The tracking divisor/update circuit 406 decodes mode select bits 144 using decoder 450. The design of a decoder 450 to accomplish this decoding is well-known in the art. In the preferred embodiment of the present invention, there are two mode select bits 144. Correspondingly, there are four update states that can be selected. The update states are no tracking, slow tracking, medium tracking, and fast tracking.

The decoder 450 asserts one of a no tracking signal 466, a slow tracking signal 464, a medium tracking signal 462, and a fast tracking signal 460.

A clock divider circuit 452 inputs the source signal 130. The clock divider circuit implements a divider circuit to divide the source clock signal 451. Divider circuits are well known in the art. The clock divider circuit 452 outputs a divided down clock corresponding to each of the update rates that a user can select via mode select 144. In the preferred embodiment of the present invention, the clock divider circuit 452 outputs a slow update clock 468, a medium update clock 470, and a fast update clock 472.

The clock divider circuit output clock signals 468, 470, and 472 are input to track enable signal generation circuit 482. In a preferred embodiment of the present invention, the track enable signal generation circuit 482 comprises AND gates 454, 456, and 458; and OR gate 479. AND gates 454, 456 and 458 output (enable) their respective input clock signal 468, 470, or 472 if the decoder 452 asserts their respective control signal 464, 462, or 460. The AND gates 454, 456, and 458 output no clock signal if the decoder asserts the no track signal 466. The OR gate 479 passes whichever clock signal 468, 470, or 472 is enabled by AND gates 454, 456, and 458. The enabled clock signal is the track enable signal 410. Note that no clock signal is enabled if no track signal 466 is asserted.

Figure 5:
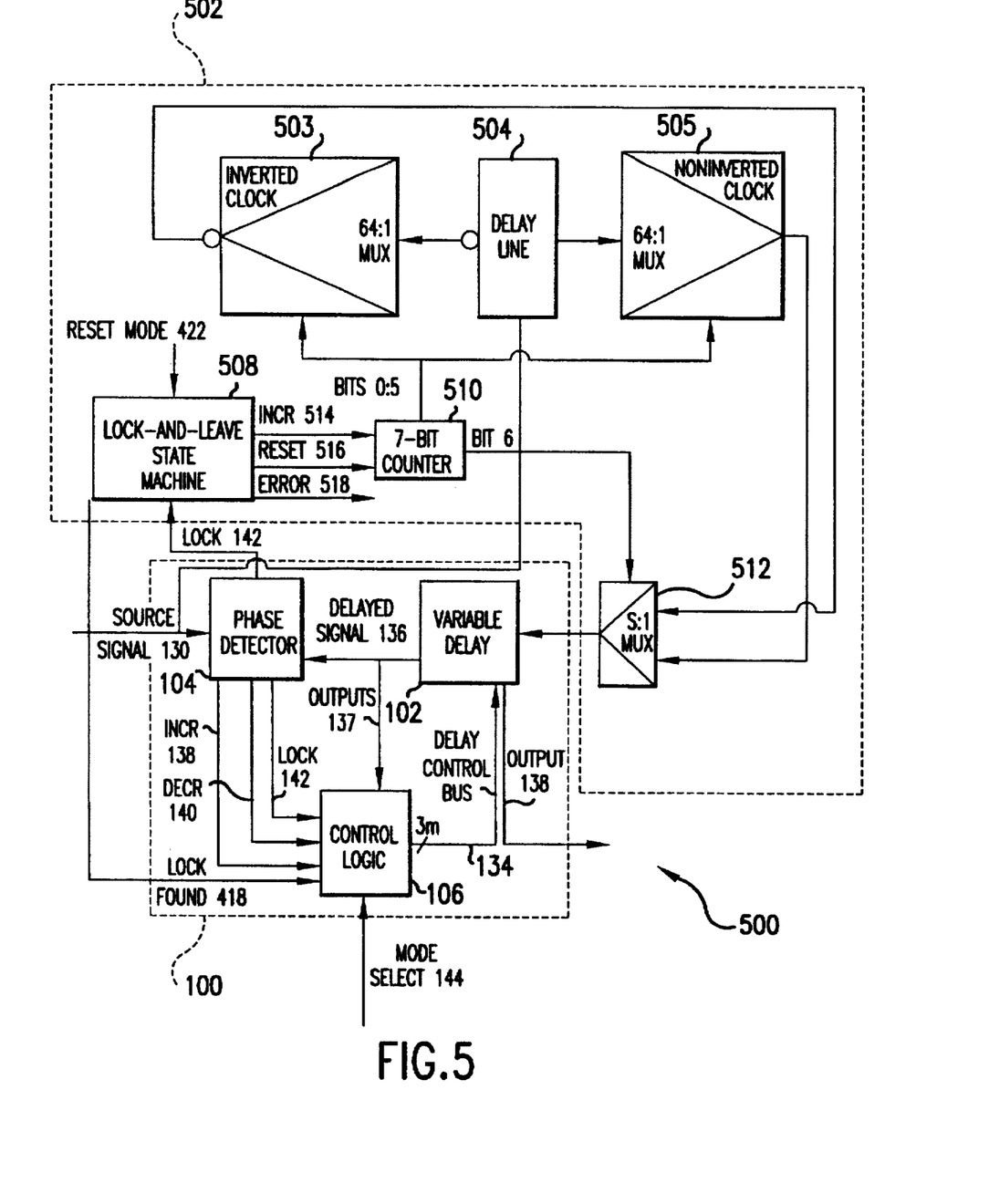
FIG. 5 is a variable tracking delay lock loop 500 according to a preferred embodiment of the present invention.

Referring to FIG. 5, a variable tracking digital delay-locked loop 500 is illustrated. The variable digital delay-locked loop 500 implements a preferred embodiment of the present invention. The variable tracking digital delay-locked loop 500 comprises the tracking circuit 100 and a lock-and-leave circuit 502. The lock-and-leave circuit 502 achieves a coarse lock. The tracking circuit 100 adds additional delay to fine tune the coarse lock achieved by the lock-and-leave circuit 502 if tracking is enabled. The output of the variable tracking digital delay-locked loop 500 is output signal 138. If tracking is not enabled, the variable tracking delay locked loop 500 outputs a clock signal delay adjusted by only the coarse amount determined by the lock-and-leave circuit 502.

According to a preferred embodiment of the present invention, the lock-and-leave circuit 502 comprises a lock-and-leave state machine 508, and counter 510, three multiplexers 503, 506, 512, and a delay line 504. The lock-and-leave state machine 508 controls the operation of the lock-and-leave circuit 502. The lock-and-leave state machine 508 determines when the system has achieved a coarse lock. The lock-and-leave state machine 508 determines coarse lock by incrementing counter 510 through all of its count states, or until lock is achieved. If lock is not achieved, an error 518 is indicated. In general, the counter 510 has $2^N$ count states where N is the number of bits in the counter. In the preferred embodiment of the present invention, counter 510 is a seven-bit counter. Therefore, the counter 510 has 128 count states. The lock-and-leave state machine cycles the counter through its 128 states, or until lock is achieved. Each state corresponds to a different delay in the delay line 504.

The phase detector 104 detects when the variable tracking delay locked loop 500 achieves lock. If the phase detector 104 indicates that the variable digital delay-locked loop 500 has not yet achieved lock, the lock-and-leave state machine 508 causes the counter 510 to increment to the next delay in delay line 504. If the phase detector 104 asserts the lock signal 142, indicating that the variable tracking digital delay-locked loop 500 has achieved phase lock, the lock-and-leave state machine 508 causes the counter 510 to stop counting. At this point the variable tracking digital delay-locked loop 500 has achieved a coarse lock. The lock-and-leave state machine 508 causes the counter 510 value to remain constant until the variable tracking digital delay-locked loop 500 is restarted or reset. The variable tracking digital delay-locked loop 500 is reset by asserting the reset mode 422 signal. This causes the lock-and-leave state machine 508 to generate a reset control signal 516 to reset counter 510.

In the preferred embodiment of the present invention, the delay line 504 comprises a plurality of CMOS inverters. An output from each inverter is input to one of two multiplexers 503 or 506. The output from a non-inverting pair of CMOS inverters (i.e., even pairs) are input to multiplexer 506. The output from inverting pairs of CMOS inverters (i.e., odd pairs) are inputs to multiplexer 503. This technique increases the resolution of the delay line by conceptually splitting the delay line into two delay lines, wherein one delay line is offset from the other by an amount less than an inverter delay.

In the preferred embodiment, there are 128 CMOS inverters. Sixty-four of the outputs are input to multiplexer 506 (even inverter pairs). The remaining pairs (odd inverter pairs) are input to multiplexer 503. Bits 5-0 of counter 510 are used as select inputs by the multiplexers 503 and 506. Bit 6 of the counter 510 is used as the input select to multiplexer 512. The input select selects between the outputs of multiplexers 503 and 506. For counts 0-63, multiplexer 512 selects the output of multiplexer 506. For counts 64-127, multiplexer 512 selects the output of multiplexer 503.

The preferred embodiment of the present invention was implemented on an application specific integrated circuit (ASIC). An ASIC is a semi-custom design methodology. Thus, an ASIC designer does not have the complete freedom that designers using fall custom technologies enjoy. Generally ASICs, have transistors of fixed sizes that a designer can connect with custom routing.

As described above, the delay line 504 comprises a plurality of taps. Each tap is a CMOS inverter pair. The pull-down transistor in a CMOS inverter is generally an NMOS device. Electrons carry the current in an NMOS device. The pull-up transistor in a CMOS inverter is generally a PMOS device. Holes carry the current in a PMOS device. Holes are about twice the size of an electron. Thus, the transistor channel in a PMOS device must be approximately twice the width of a corresponding channel of an NMOS device to get the same current flow. ASICs do not generally allow designers to change the width of devices. Thus, ASIC designers generally use two PMOS devices for the pull-up transistor and one NMOS device for the pull-down transistor. This preserves the symmetry of the rising and falling edges of signals traveling through the CMOS inverter.

As a signal propagates along the delay line 504, large amounts of switching charge is sourced into and out of VDD and ground. This switching noise is undesirable and can degrade the performance of the circuit. The inventors discovered that by configuring the unused NMOS transistors as capacitors, this switching noise could be significantly reduced or eliminated. Thus, each extra NMOS transistor is configured as a capacitor between $V_{DD}$ and ground. Configuring the extra NMOS transistor in this manner has the effect of filtering the charge.

Figure 6:
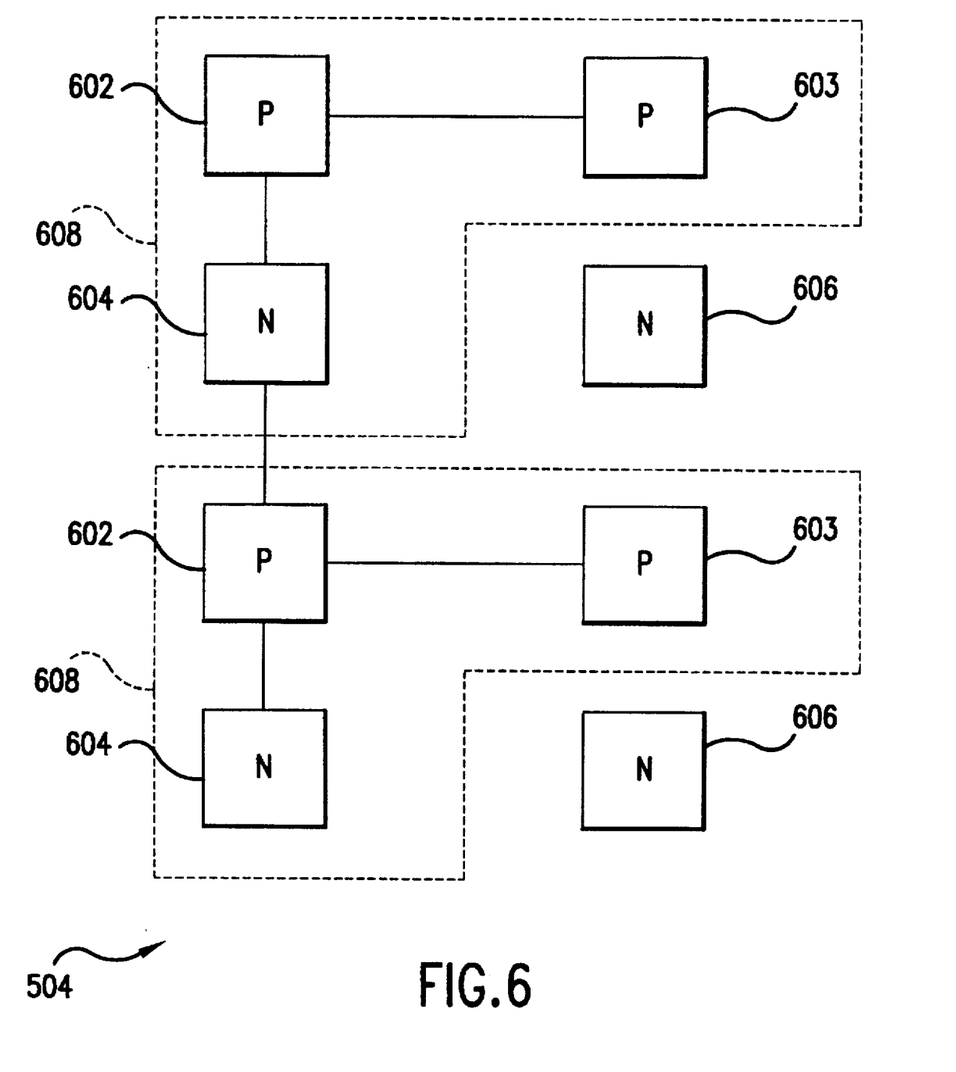
FIG. 6 illustrates a transistor layout for a delay line 504 according to a preferred embodiment of the present invention that is implemented using gate array technology.

Referring to FIG. 6, the PMOS transistors 602, 603 are coupled to enable a current substantially equal to the current in a single NMOS device. The pair so coupled is further coupled to a single NMOS device 604 to form a CMOS inverter 608. The inverters 608 are coupled pairwise to form taps. The taps are coupled to form a delay line 504. Configuring NMOS transistor 606 as a capacitor between $V_{DD}$ and ground effectively bypasses excess switching charge, caused by the propagation of a signal through the delay line 504.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An apparatus, comprising:
   a variable delay circuit to delay a source signal by a variable amount in accordance with a delay control signal, and to output a delayed source signal;
   a phase detector coupled to said variable delay circuit to measure a phase difference between said source signal and said delayed source signal, and to generate update control information corresponding to said phase difference; and
   a control circuit coupled to said variable delay circuit and to said phase detector to generate said delay control signal in response to said update control information, said control circuit including a tracking state machine coupled to said phase detector to input said update control information and to control an update rate of said delay control signal.

2. An apparatus, comprising:
   a variable delay circuit to delay a source signal by a variable amount in accordance with a delay control signal, and to output a delayed source signal;
   a phase detector coupled to said variable delay circuit to measure a phase difference between said source signal and said delayed source signal, and to generate update control information corresponding to said phase difference; and
   a control circuit coupled to said variable delay circuit and to said phase detector to generate said delay control signal in response to said update control information; said variable delay circuit including
   a delay line to delay said source signal, said delay line having a plurality of taps, each of said taps producing a delayed version of said source signal,
   a counter to store a count,
   a multiplexer coupled to said delay line and to said counter to select one of said taps of said delay line according to said count, and outputting said delayed version of said source signal produced by said selected one of said taps to produce said delayed source signal, and
   a lock and leave state machine coupled to said control circuit and to said counter to produce said count such that said multiplexer output causes said phase detector to indicate a lock condition, and wherein said lock and leave state machine causes said count to remain fixed while said phase detector indicates said lock condition.

3. A method comprising the steps of:
   (a) delaying a source signal by a varying amount corresponding to a delay control signal to produce a delayed source signal;
   (b) generating a phase difference signal corresponding to a phase difference between said source signal and said delayed source signal;

(c) updating said delay control signal based on said phase difference signal; and (d) using a tracking state machine to control an update rate of said delay control signal.

4. The apparatus as recited in claim 1, wherein said control circuit further comprises a tracking divisor/update circuit coupled to said tracking state machine to generate a track enable signal in accordance with a mode select signal to control said update rate of said delay control signal.

5. The apparatus as recited in claim 4, wherein said tracking divisor/update circuit comprises:

a decoder to input said mode select signal and to generate a decoder output that corresponds to said update rate in accordance with said mode select signal;

a clock divider circuit to generate a plurality of update clock signals using said source signal; and a track enable signal generation circuit coupled to said decoder and to said clock divider circuit to generate said track enable signal corresponding to one of said plurality of update clock signals in accordance with said decoder output.

6. The apparatus as recited in claim 4, wherein said control circuit further comprises:

an up/down counter coupled to said tracking state machine for performing at least one of incrementing and decrementing a count based on a count control signal; and a second decoder coupled to said up/down counter for decoding said count to produce said delay control signal; and wherein said tracking state machine provides said count control signal based on said tracking) enable signal.

7. The apparatus of claim 2, wherein said delay line includes a plurality of inverting taps, said inverting taps producing an inverted delayed version of said source signal, further comprising:

a second multiplexer coupled to said delay line to select one of said inverting taps of said delay line according to said count, and outputting said inverted delayed version of said source signal produced by said selected one of said inverting taps to produce an inverted delayed source signal; and a third multiplexer to select one of said delayed source signal and said inverted delayed source signal as a multiplexer output.

8. The apparatus of claim 7, wherein said variable delay circuit delays said multiplexer output by a variable amount.

9. The method of claim 3, wherein step (a) further comprises the steps of:

delaying said source signal to produce a plurality of source inputs, each having a different delay;

selecting one of said plurality of source inputs as a selected source input to cause said phase difference to fall within a predetermined window; and delaying said selected source signal to produce said delayed source signal.

10. The method of claim 3, wherein step (d) further comprises the steps of:

determining an update rate at which said delay control signal is updated; and updating said delay control signal according to said update rate.

11. A method comprising the steps of:

(a) generating a delayed source signal by delaying a source signal by an amount corresponding to a delay control signal;

(b) generating a phase difference signal corresponding to a phase difference between said delayed source signal and said source signal;

(c) updating a counter to control a rate at which said delay control signal is updated; and (d) updating said delay control signal in accordance with a count in said counter.

12. The method of claim 11, wherein step (a) further comprises:

delaying said source signal to produce a plurality of source inputs, each having a different delay;

selecting one of said plurality of source inputs as a selected source input to cause a phase detector to indicate a lock condition when said phase detector compares said delayed source signal with said selected source input; and delaying said selected source input to output said delayed source signal.

13. The method of claim 11, wherein step (d) further comprises:

determining an update rate at which said delay control signal is updated; and updating said delay control signal in accordance with said update rate.

14. The apparatus as recited in claim 4, wherein said mode select signal is an N bit control word yielding $2^N$ update rates.

* * * * *